United States Patent [19]

No et al.

[11] Patent Number: 5,811,219

[45] Date of Patent: Sep. 22, 1998

[54] PIGMENT-DISPERSED PHOTORESIST COMPOSITION FOR COLOR FILTER OF LIQUID CRYSTAL DISPLAY

[75] Inventors: Tae Whan No, Suwon-Si; Dae Woo Im, Seoul; Soon Sik Kim, Seoul; Sang Woon Lee, Seoul, all of Rep. of Korea

[73] Assignee: Cheil Synthetics Incorporation, Kyongsangbuk-Do, Rep. of Korea

[21] Appl. No.: 588,102

[22] Filed: Jan. 18, 1996

[30] Foreign Application Priority Data

Jan. 20, 1995 [KR] Rep. of Korea .................. 1995-962

[51] Int. Cl.$^6$ ..................... G03F 7/033; G03F 7/031; G02B 5/20; G02B 1/1335
[52] U.S. Cl. .................. 430/287.1; 430/7; 430/281.1; 430/284.1; 430/292; 430/910
[58] Field of Search .................. 430/287.1, 910, 430/7, 281.1, 284.1, 292, 293, 294; 522/95, 106, 109, 110

[56] References Cited

U.S. PATENT DOCUMENTS

| | | | |
|---|---|---|---|
| 4,120,721 | 10/1978 | Ketley et al. | 430/284.1 |
| 4,511,645 | 4/1985 | Koike et al. | 430/287.1 |
| 5,153,095 | 10/1992 | Kawamura et al. | 430/910 |

FOREIGN PATENT DOCUMENTS 62-212436  9/1987  Japan .

*Primary Examiner*—John A. McPherson
*Attorney, Agent, or Firm*—Harrison & Egbert

[57] ABSTRACT

A pigment-dispersed photoresist composition for a color filter of liquid crystal display, which comprises a photosensitive resin composition comprising a binder resin, a multifunctional acrylate monomer or oligomer, a polyene compound containing at least unsaturated group the main chain of which may be substituted with esters or urethanes, a multifunctional thiol compound, a photopolymerization initiator, a sensitizer, a soft polymerization inhibitor and an organic solvent, and a pigment-dispersed composition comprising pigment, a polymeric dispersing agent and/or a pigment-derived dispersing agent in combination with a surfactant a leveling agent, a slip agent, an antifoaming agent and an organic solvent, is disclosed. Superior in physical properties including thermal resistance, light fastness, spectroscopicity, color reproduction (chromaticity), dispersing stability, adhesiveness to substrate, resolution and photosensitivity, the pigment-dispersed photoresist composition can afford a fine pattern with high definition.

4 Claims, 5 Drawing Sheets

PIGMENT-DISPERSED PHOTORESIST COMPOSITION FOR COLOR FILTER OF LIQUID CRYSTAL DISPLAY

BACKGROUND OF THE INVENTION

1. Field of the Invention

The present invention relates to a pigment-dispersed photoresist composition for the color filter of liquid crystal display, consisting mainly of photoresist composition and pigment composition, which is excellent in photosensitivity and spectroscopicity.

2. Description of the Prior Art

As society becomes more and more information-intensive it produces an immense quantity of various information every day and thus, recording media with higher capability have been developed. In the last few years, surprising achievements have been made in a field of visible information. Particularly, a display, a device on which information is projected in words, numbers or drawings, has strongly been required to be more light, more compact and more thin in addition to being able to represent the information in colors.

Attracting scientific and commercial attention, liquid crystal color displays have been and continues to be considered as a very promising choice capable of satisfying such demand, and its development is being watched with keen interest. To date, it is useful as an image display element for a plurality of purposes including, for example, liquid crystal television receiver, video monitor, camera, scanner, laptop word processor, notebook personal computer, car-mounted television receiver, television receiver with large screen, game pack and so on. Of course, liquid crystal color displays are required to be significantly improved in their functions.

In liquid crystal color display, a color filter is one of the most important parts which reproduce color signals. In addition, it holds the key for the solution of such problems as improvement in picture quality, quality stabilization for securing reliability according to expansion of use conditions, and reduction in production cost through simplification of process.

Typically, a color filter for liquid crystal display is prepared by forming red, green and blue picture elements and a black matrix on a substrate (alkaliless special glass for liquid crystal display). To date, various processes are engaged in preparation of a color filter for liquid cryatal display. For example, dye process, print process, pigment dispersion process, electrodeposition process and inorganic multilayer thin film process (including chemical deposition process) are introduced.

In the dye technology, a photosensitive natural resin, for example, gelatin, or a photosensitive synthetic resin, for example, amine-modified polyvinyl alcohol, is treated with dye. The color filter thus obtained is, however, noticeably lowered in thermal resistance, light stability and moisture resistance.

As to the print technology, pigment is dispersed in a photosetting resin to give ink which is then subjected to offset print, screen print, decalcomania or letterpress print. This process has advantages that the color filter can be produced in low price, allowing the display to have a large screen. However, it is seriously problematic in formation of a fine pattern with high definition, accomplishment of spectroscopic properties identical to those of existing Braun tube, and color reproduction on chromaticity diagram.

An electrodeposition technology consists broadly of dispersing pigment in a suitable solvent and electrodepositing the dispersed system by use of electrodes formed on a substrate. This process is advantageous in that the resulting color filter is superior in light stability and thermal resistance. However, the electrodeposition process is very complicated. For example, it needs transparent electrodes in order to form a pigment layer. Further, it demands additional electrodes on a surface of the color filter in order to drive liquid crystal because the pigment layer formed comes to be an insulation layer.

Among technologies known as inorganic multilayer thin film processes is deposition of nickel or chrome by which a black matrix is formed. This process can provide good light-shielding rate and resolution. Significant disadvantages of this process are that it is complicated, needs enormous equipment investment and costs very much to operate.

With regard to pigment dispersion, a resist composition consisting of various pigments dispersed in a photosensitive resin is subjected to photolithography, so as to produce a photoresist. For a good result, the pigment-dispersed resist composition is required to have a highly photosensitive polymer therein which is capable of not only initiating itself into photosetting reaction but also promoting this reaction in itself even though intensity of light is attenuated by the pigment. In addition, the composition must be stable to and be with ease applied to the steps of coating, exposure and development. First above all, pigment with a particle size of submicrons, for example, 0.01 to 0.5 $\mu$m, is needed to be uniformly dispersed in the photosensitive resin, to give superior color filter for liquid crystal display. Further, the pigment-dispersed resist composition must secure stability according to long storage of at least 3 months. Light stability, thermal resistance, moisture resistance and chemical resistance are fundamental properties which the composition should posses. Superior chromaticity is essential to the composition, as well.

In contrast with electron setting, uv setting has an advantage of being able to be performed in air. Oxygen contained in air, however, may quench free radicals during uv setting, resulting in deterioration of curing degree. Since the surface of photosetting film has an oxygen concentration of as high as two or three times of that of the inside of curing film, the inhibiting action of oxygen for the photo-polymerization of film is active particularly on the surface. Thus, light abosorbance is required to be high in order to increase the polymerization reaction rate initiated by light. This means that the intensity of incident light is high, with restriction of oxygen from being consumed on the surface and from being diffused into the inside of the film by the photo-reaction. It is possible to decrease the influence of oxygen by increasing the concentration of photo-initiator but too much initiator diminishes the light absorbance in the inside of film, leading to incomplete photosetting. As a result, there occurs a significant disadvantage that the total curing state of film cannot be known simply by measuring the degree of cure on the surface.

Accordingly, the photo-curing of film is based on the keeping of light initiator as low as possible so as to bring the surface of film into an appropriate curing state. To overcome the inhibition of photo-polymerization in air, the following conditions are considered. First, illumination of light is carried out in inert atmosphere such as nitrogen. A protective film may be used. For example, a protective polyester film is employed for dry film resist. Alternatively, illumination of light may be done in water because the air has an oxygen concentration of as high as 100 times of that of water.

Finally, particular photo initiators, such as triazine compounds and imidazole compounds, are added, as disclosed in Japanese Pat. Nos Hei 1-152449 and Hei 6-201913.

SUMMARY OF THE INVENTION

Therefore, it is a principal object of the present invention to provide a high-sensitive, pigment-dispersed resist composition which is not affected by oxygen when using radical photo initiators for curing, thereby avoiding the aforementioned problems associated with the prior arts.

It is another object of the present invention to provide a resist composition for color filter of liquid crystal display, which exhibits superiority in spectroscopic property, photosensitivity, resolution, surface flatness and thermal resistance.

It is a further object of the present invention to provide a pigment-dispersed photoresist composition for a color filter of liquid crystal display, with which a fine pattern of high definition can be formed.

Based on the intensive and thorough research by the present inventors, the above objects could be accomplished by adding thiol compounds and/or ethylenically unsaturated polymers in a resin composition.

In accordance with an aspect of the present invention, there is provided a pigment-dispersed photoresist composition for a color filter of liquid crystal display, which comprises a photosensitive resin composition comprising a binder resin, a multifunctional acrylate ologomer, a polyene compound containing at least unsaturated group the main chain of which may be substituted with esters or urethanes, a multifunctional thiol compound, a photopolymerization initiator, a sensitizer, a soft polymerization inhibitor and an organic solvent, and a pigment-dispersed composition comprising pigment, a polymeric dispersing agent and/or a pigment-derived dispersing agent in combination with a surfactant a leveling agent, a slip agent, an antifoaming agent and an organic solvent.

Superior in physical properties including thermal resistance, light fastness, spectroscopicity, color reproduction (chromatocity), dispersing stability, adhesiveness to substrate, resolution and photosensitivity, the pigment-dispersed photoresist composition can afford a fine pattern with high definition.

DETAILED DESCRIPTION OF THE INVENTION

Figure 1:
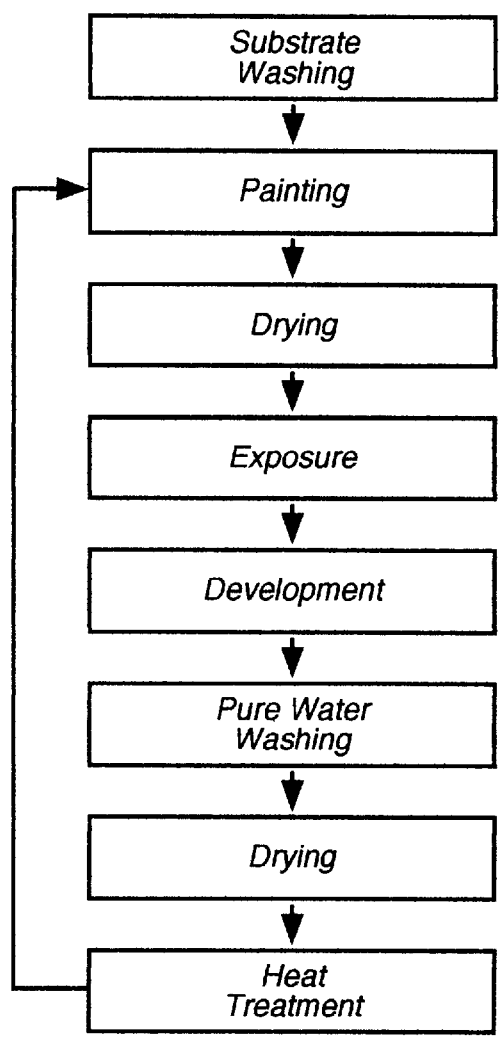
FIG. 1 is a block diagram illustrating the photolithography used for the preparation of the photo resist composition.

The multifunctional thiol compound used in the present invention has at least one SH group the represent examples of which include glycol dimercaptoacetate, trimethylolethane tris(3-mercaptopropionate), and pentaerythritol tetrakis(thiolglycolate), As to polyene, a compound having at least one unsaturated group can be empolyed in the composition of the present invention the main chain of which may partially substituted with ester or urethane.

Upon being exposed to light, such multifunctional thiol and polyene compounds react with each other to form linear and steric network structures, thereby obtaining desirable patterns. As a result, the reduction in initiation rate of photopolymerization, caused by oxygen, does not occur, so that high sensitivity can be achieved in air without using a protective film.

In the pigment-dispersed photoresist composition of the present invention, there is used an effective amount of a binder resin represented by the following general formula I:

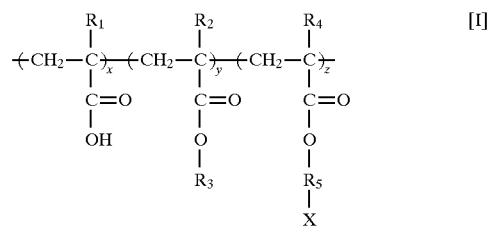

wherein
$R_1$ is H, $CH_3$ or $CH_2COOH$;
$R_2$ is H or $CH_3$
$R_3$ is an alkyl group containing 1 to 10 carbon atoms, a phenyl group, a benzyl group or

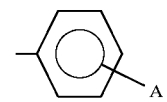

wherein A is H, Cl, Br, F, $NO_2$, or $—C_lH_{2l+1}$ wherein l is an integer of 1 to 6;
$R_4$ is H or $CH_3$;
$R_5$ is $(CH_2)_m$ wherein m is an integer of 1 to 10;
X is —OH, —(CH=CH)$_n$H wherein n is an integer of 1 to 4,
—OCO—(—CH=CH)$_n$—B wherein n is an integer of 1 to 4 and B is

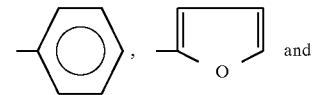

x, y, and z represent mole ratios among the moieties, ranging from 5 to 40 mole %, 30 to 95 mole % and 0.1 to 75 mole %, respectively.

In accordance with the present invention, a photosensitive resin composition may be prepared by mixing 5–60 weight parts of multifunctional acrylate monomer or oligomer, 0.01–50 weight parts of polyene compound containing at least one unsaruated groups 0.01–50 weight parts of multifunctional thiol group, 0.1–50 weight parts of photopolymerization initiator and other additives with 100 weight parts of the binder represented by Formula I in an organic solvent.

The binder resin is a kind of terpolymer consisting of unsaturated organic acid, unsaturated organic acid ester, and unsaturated organic acid ester containing photosensitive groups such as allyl group, cynamoyl group or acryloyl group.

A multifunctional acrylate oligomer is added in order to provide high photo-crosslink density for the binder resin, according to the present invention. Oligo ester acrylate, oligo epoxy acrylate, and oligo urethane acylate may be used alon or in combination. Multifunctional acrylate monomers may be used for the same purpose. The concrete examples of multifunctional acrylate monomer include ethyleneglycol diacrylate, triethyleneglycol acrylate, 1,3-butanedioldiacrylatate, 1,4-cyclohexanedioldiacrylate, trimethyloltriacrylate, trimethylolpropanetriacrylate, pentaerythritoltriacrylate, dipentaerythritoltriacrylate, dipentaerythritoltetraacrylate, sorbitoltriacrylate, sorbitoltetraacrylate, sorbitolpentaacrylate, sorbitolhexaacrylate, tetramethylene glycoldimethacylate, triethyleneglycoldimethacrylate, trimethylolpropanetrimethacrylate, ethylene glycol dimethacrylate, 1,3-butanedioldimethacryalte, pentaerythritoldimethacrylate, dipentaerythritoldimethacrylate, pentaerythritoltrimethacrylate, sorbitoltrimethacryltate, sorbitoltetramethacrylate, and 2-hydroxyethyl acrylate. In addition to these monomers, prepolymers, such as dimers and trimers thereof, can be useful to obtain high photo-crosslink density.

As photopolymerization initiator and sensitizer, benzophenones, acetophenones and thioxantone compounds may be used alone or in combination.

According to the present invention, the pigment-dispersed composition can be prepared by dissolving pigment and a polymeric dispersing agent and/or a pigment-derived dispersing agent in an organic solvent and dispersing the solution five to nine times in bead mill. For uniform coating property, a leveling agent, a slip agent and a surfactant may be added in an small amount. The pigment-dispersed composition may comprise an antifoaming agent, to avoid pin holes attributed to bubbles which are generated upon spin coating or dispersing. Preferably, the pigment is filtered to have an average diameter distribution of 0.05 to 0.5 micron, prior to addition to the composition.

When preparing the pigment-dispersed composition, useful polymeric dispersing agents are those that have an average molecular weight of approximately 1,000 to approximately 100,000. There is no particular limitation as to the compatibility of polymeric dispersing agent with the bihicle resin. It is used an amount of 1–200 weight parts based on 100 weight parts of pigment.

Polymeric dispersing agent is selected from a group consisting of polyamine compounds, polyacrylic compounds, polyurethane compounds, polycaprolactane compound, long chain alkylaminoamide compounds, polyisocyanate compounds, polyester compounds and the mixtures thereof. In more detail, the polymeric dispersing agent used in the present invention consists of a main chain and at least one side chain. The main chain has a framework selected from a group consisting of polyamines, polyacryls, polyesters, polyurethanes, polycaprolactanes, long-chain alkylpolyaminoamides, and polyisocyanates. The side chain, pendant from the framework, has at least one functional group selected from a group consisting of:

—COOH, —SO$_2$, —NH$_2$, —OH, —N=C=O, —O—C$_8$H$_{17}$, —P—(O—C$_8$H$_{17}$)$_2$OH, —O—C$_2$H$_4$—NH—C$_2$H$_4$—NH$_2$,

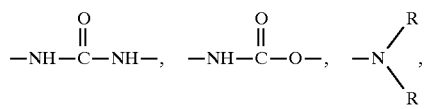

-continued

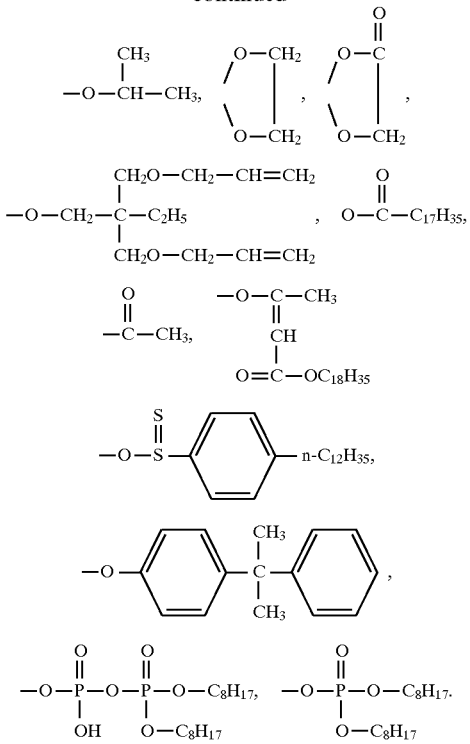

As shown above, the polymeric dispersing agent has both a pigment-absorptive functional moiety and a solubilizable chain, showing a structure that is able to maximize the steric hinderance effect attributable to the adsorption of polymer to the surface of pigment. Such polymeric dispersing agent does not allow the pigment particles to agglomerate, so that the pigment dispersed composition according to the present invention is capable of forming a thick coating layer.

In combination with the polymeric dispersing agent, the pigment-derived dispersing agent may be used in the pigment-dispersed composition, represented by the following general formula II:

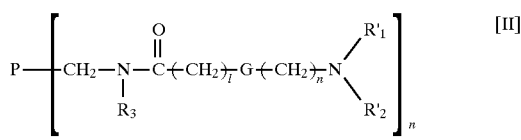

wherein
P is an organic pigment selected from a group consisting of quinacridones, anthraquinones, anthanthrones, indigoes, styrenes, thioindigoes, azo·diazo·polycondensed azo compounds, imidazoles, arylamide(acylamino), isoindolines, perylenes, phthalocyanines, metine and azo-metines, dioxazines, anilines, flanvanthrones, pyranthrones, isoviolpanthrone, indanthrones, phthalones, dianthraquinones, and quinophthalones;

G is a sulfone group, a carbonyl group, an ester group or a phosphoryl group;

R$_1$ and R$_2$ are independently a hydrogen atom, an unsubstituted alkyl group, a substituted alkyl group, a cycloalkyl group, an aryl group and a group with plural rings;

R$_3$ is a hydrogen atom, an alkyl group or an alkyl amine;
l is an integer of 1 to 4;

n is an integer of 1 to 20; and m is an integer of 1 to 6.

Taking charge of a function of dispersing promoter, the pigment-derived dispersing agent also plays a role of color matching. Besides, it brings excellent effect into improvement in pigment dispersibility in the photoresist composition for a color filter of liquid crystal display. When being used along with the polymeric dispersing agent, the pigment-derived dispersing agent serves as an anchor on a surface of the pigment. At the moment, the pigment-derived dispersing agent is added at an amount of approximately 1 to 200 weight parts, based on 100 weight parts of pigment. When the pigment-derived dispersing agent may be used as a co-pigment for color matching, a preperable amount also falls between 1 to 200 weight parts based on the 100 weight parts of pigment.

Various pigments can be used in the pigment-dispersed composition of the present invention. For example, Color Index Nos 9, 97, 122, 123, 149, 168, 177, 178, 179, 180, 192, 202, 220, 215 and 254 can be used for red pigment, Color Index Nos. 7 and 36 for green pigment, Color Index Nos. 15, 22, 60 and 64 for blue pigment, Color Index Nos. 20, 24, 83, 86, 93, 109, 110, 117, 125, 137, 138, 139, 147, 148, 153, 154, 166 and 168 for yellow pigment, Color Index Nos. 36, 43, 51, 55, 59, 61 and 64 for orange pigment, Color Index Nos. 19, 23, 29, 30, 37, 40 and 50 for violet pigment, Color index Nos. 1, 7, 11, 22, 27, 30 and 31 for black pigment, and titinium dioxide, white lead, zinc oxide and lithopone for white pigment. These pigments may be used singly or in mixture, to prepare pigment-dispersed photoresist which is of superiority in color reproduction.

As previously mentioned, the pigment-dispersed photoresist composition for a color filter of liquid crystal display according to the present invention may comprise various agents, such as an antifoaming agent, an antisedimenting agent, a slip agent, a leveling agent, surfactant, and other additives.

Function of an antifoaming agent is to solve a problem of pin hole caused by foam when effecting dispersion or spin coat, and it may be added in an amount of approximately 1 to 100 weight parts based on 100 weight parts of pigment added.

To prevent pigment particles from being sedimented during long storage, an antisedimenting agent may be added in an amount of approximately 1 to 100 weight parts based on 100 weight parts of pigment and may be selected from a group consisting of bentonite, talc, dolomite, caolinite, pyrophyllite, diatomaceous earth, barite, calcium carbonate ($CaCO_3$), alumina, and silica.

Gelation of pigment-dispersed composition, a highly thixotropic phenomenon, is likely to occur when the concentration of pigment in the pigment-dispersed composition is high. This may be prevented by a slip agent.

After coating the pigment-dispersed composition, addition of a leveling agent allows the resulting coat to exhibit improved surface flatness.

A surfactant is helpful to improve the compatibility of pigment and dispersing agent with organic solvent. In the pigment-dispersed photoresist composition of the present invention, it may be cationic, anionic or non-ionic. Amount of surfactant may be on the order of approximately 1 to 100 weight parts based on 100 weight parts of pigment.

Other additives used in the present invention are to solve typical problems generated upon preparing the usual pigment-dispersed solution, such as flooding, floating, blocking and adhesion to substrate, and may be added in an amount of approximately 1 to 50 weight parts based on 100 weight parts of pigment.

An organic solvent is used for dispersion and viscosity adjustment of the photoresist composition and pigment-dispersed composition. Depending on the compositions of the binder resin and the kinds of the monomer and photopolymerization initiator, the selection of organic solvent is usually done among toluene, xylene, ethylcellosolve, ethylcellosolve acetate, diclime and cyclohexanonetoluene. Its amount to be used is adjusted in a range of 10 to 90 weight percent based on the total amount of the composition.

A better understanding of the present invention may be obtained in light of following examples which are set forth to illustrate, but are not to be construed to limit, the present invention.

EXAMPLE I

Preparation of Photoresist Composition

Two photoresist compositions, each employing an acrylic terpolymer resin (1), represented by the following molecular formula:

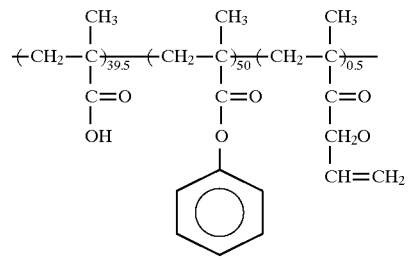

and an acrylic terpolymer resin (2), represented by the following molecular formula;

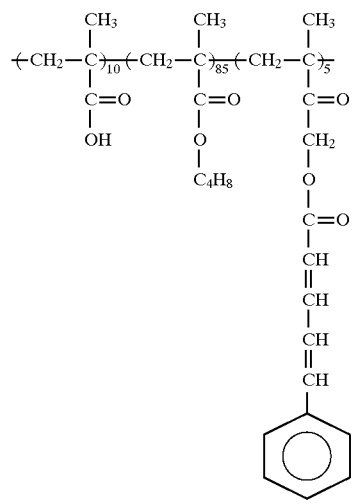

as a binder resin, and six pigment-dispersed compositions, each comprising a polymeric dispersing agent and pigment-derived dispersing agent, were prepared as indicated in Tables 1 and 2 below. Thereafter, the photoresist compositions and pigment-dispersed compositions were combined as instructed in Table 3 and the combinations were added with an organic solvent so as to adjust their viscosity into 5–50 centipoise.

TABLE 1

| Component | (unit/g) Photoresist Composition | |
| --- | --- | --- |
| | 1 | 2 |
| Resin 1 Type Acrylic Terpolymer | 37.00 | — |
| Resin 2 Type Acrylic Terpolymer | — | 25.00 |
| Pentaerythritotetraacrylate | 6.00 | 15.00 |
| Pentaerythritoltetrakis(thiolglycolate) | 1.00 | 3.00 |
| P-(Dimethylamino)benzophenone | 5.00 | 5.00 |
| 2,4-Diethylthioxanthone | 3.99 | 3.99 |
| Hydroquinone | 0.01 | 0.01 |
| Ethylcellosolve acetate | 48.00 | 48.00 |

TABLE 2

| | Example No. | | | | | (unit:g) |
| --- | --- | --- | --- | --- | --- | --- |
| Component | 1 | 2 | 3 | 4 | 5 | 6 |
| Pigment | C.I.PY177 | C.I.PY139 | C.I.PG36 | C.I.PB15:6 | C.I.PV23 | C.I.PR7 |
| | 35.0 | 8.0 | 50.0 | 15.0 | 20.0 | 20.0 |
| Polymeric‡ | PA | PAc | PI + AAA | PET | PU + PCa | PET |
| Dispersing Agent | 26.0 | 10.0 | 3.0 | 5.0 | 6.3 | 10.0 |
| Pigment-Derived‡‡ | Atrq | Isoind | Ptlc | Ptlc | Dioxazine | Ptlc |
| Dispersing Agent | 5.0 | 2.0 | 10.0 | 5.0 | 10.0 | 10.0 |
| Surfactant | 1.0 | 0.7 | 1.0 | — | 0.7 | 2.0 |
| Leveling Agent | 2.0 | 1.0 | — | — | 0.5 | 3.0 |
| Surfactant | 1.0 | 0.7 | 1.0 | — | 0.7 | 2.0 |
| Leveling Agent | 2.0 | 1.0 | — | — | 0.5 | 3.0 |
| Slip Agent | 1.0 | — | 0.5 | 0.5 | 0.4 | 1.0 |
| Antifoaming Agent | — | 0.3 | 0.5 | 0.5 | 0.3 | 0.5 |
| Antisedimenting Agent | 1.0 | — | 1.0 | — | 0.8 | 0.5 |
| Organic Solvent | 39.0 | 48.0 | 54.0 | 74.0 | 11.0 | 53.0 |

‡PA: polyamine, PAc: polyacryl, PI: polyisocyanate, PCa: Polycarprolactane AAA: Long-Chain alkylaminiamide, PET: polyester, PU: polyurethane
‡‡Atrq: Anthraquinone, Isoind: Isoindoline, Ptlc: Phthalocyanine

Preparation of Color Filter

Figure 2:
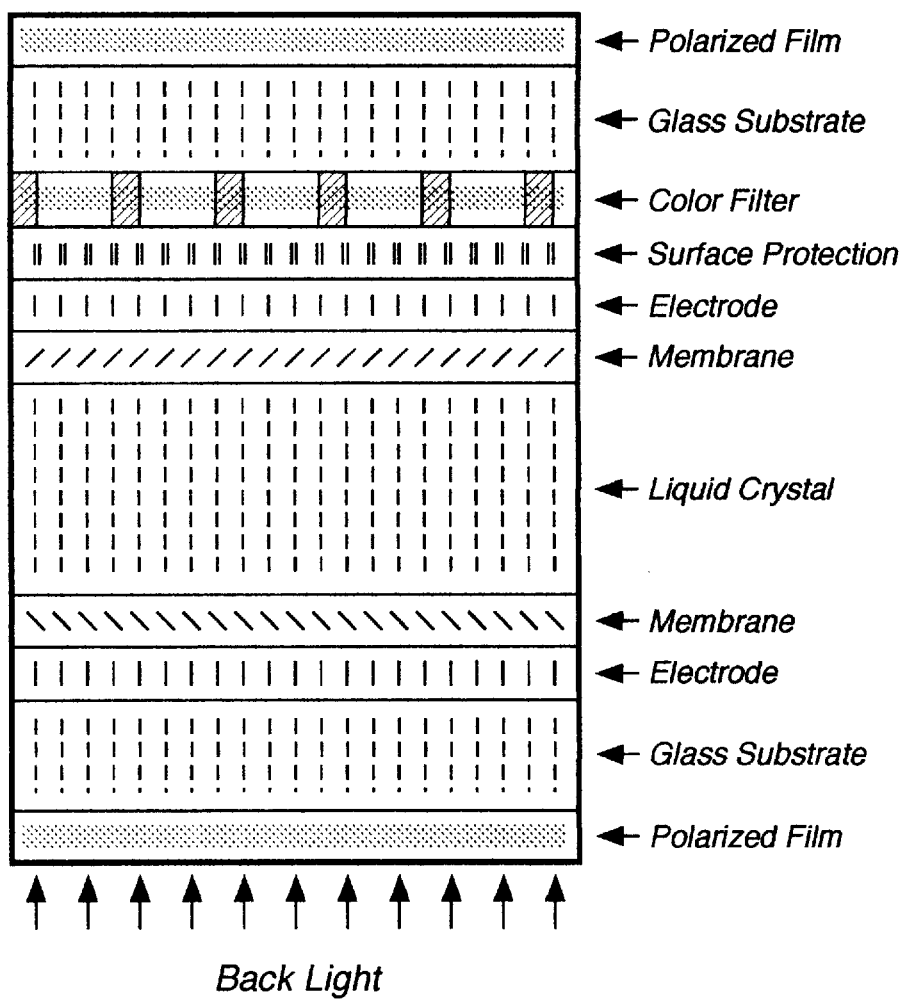
FIG. 2 is an illustration of the color filter formed by the present invention.

The photoresist compositions prepared as shown in Table 3 were used alone or in combinations, to give color resists with standard red, green, blue and/or black colors. These resists were subjected to the photolithography illustrated in FIG. 1, to form color filters shown in FIG. 2.

TABLE 3

| | | Unit: wt parts |
| --- | --- | --- |
| Combination No | Photoresist Composition (Type) | Pigment-Dispersed Composition (Type) |
| 1 | (1) 100 | (1) 90 |
| 2 | (2) 100 | (2) 30 |
| 3 | (1) 100 | (3) 60 |
| 4 | (1) 100 | (4) 40 |
| 5 | (2) 100 | (5) 10 |
| 6 | (2) 100 | (6) 20 |

COMPARATIVE EXAMPLE I

A color filter was prepared using a resist which was obtained with gelatin and red, green, blue and black pigments in a conventional manner.

COMPARATIVE EXAMPLE II

A resist was prepared by dispersing pigment in a copolymer of benzinemethacrylate and methylmethacrylate, and a color filter was prepared using it.

Figure 3:
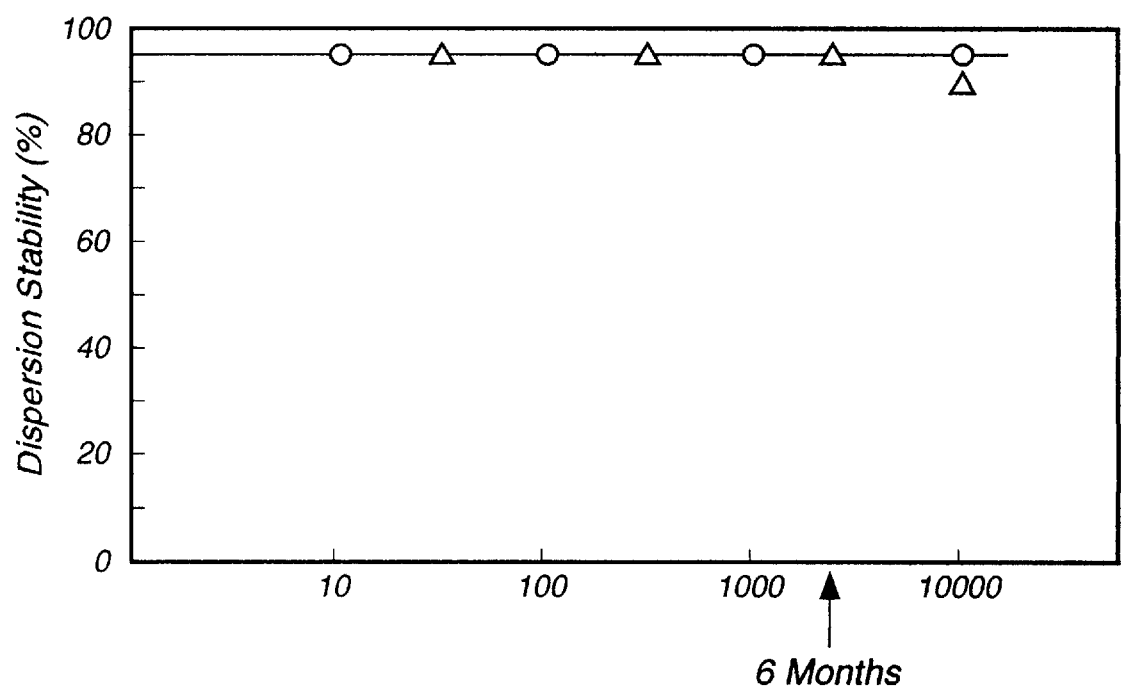
FIG. 3 is a graph illustrating dispersion stability with regard to time.
Figure 4:
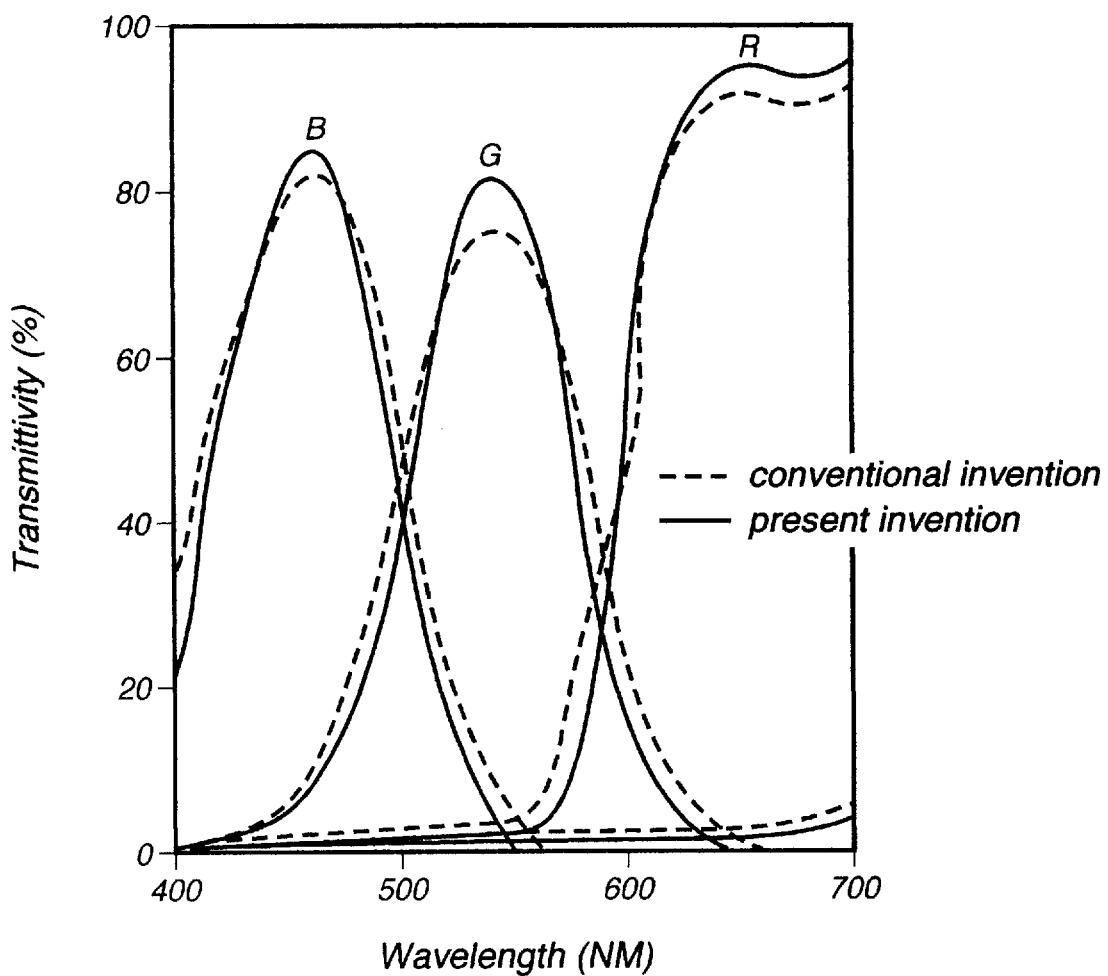
FIG. 4 is a graphical illustration of the transmittivity of the color filter according to the wavelength of incident light.
Figure 5:
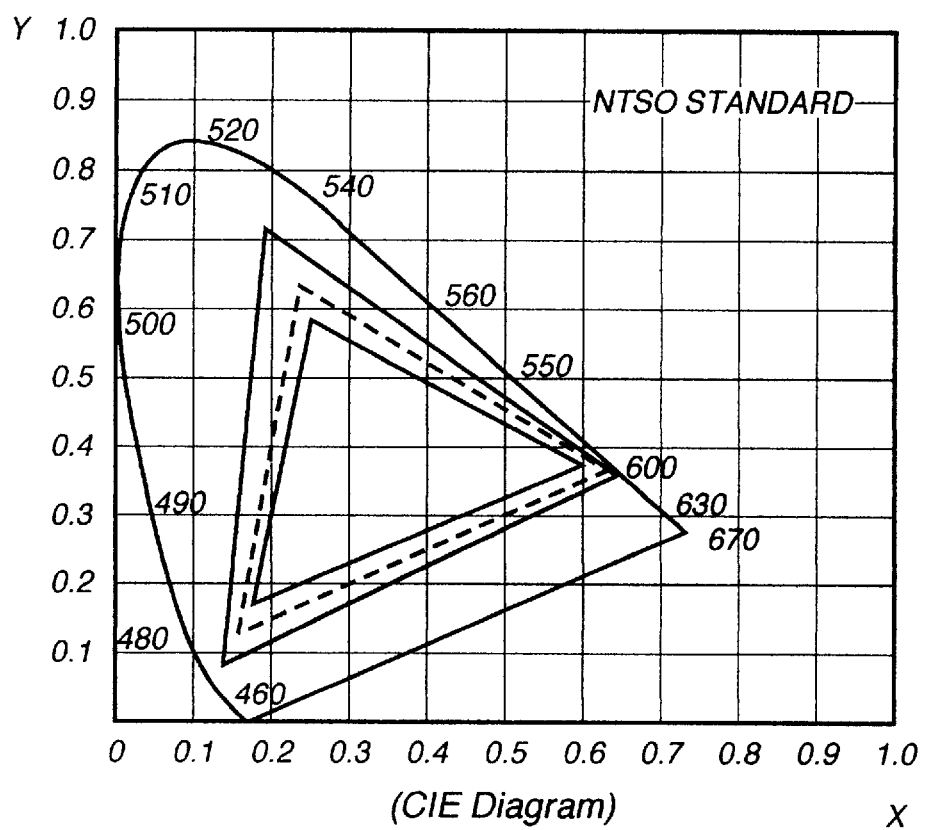
FIG. 5 is a graphical illustration of the chromaticity of the color filter.

The color filters manufactured in Example and Comparative Examples were tested for various physical and optical properties and the results are given as shown in FIGS. 3 through 5.

First, FIG. 3 shows dispersion stability with regard to time. As shown in this plot, the photoresist compositions according to the present invention can maintain superior dispersion stability for long times, even for 10,000 hours or more.

FIGS. 4 and 5 show transmittivity of the color filter according to the wavelength of incident light, and chromaticity of the color filter, respectively. As apparent from these figures, the color resist according to the present invention is far superior to conventional ones in spectroscopicity and chromaticity.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A pigment-dispersed photoresist composition for a color filter of liquid crystal display, which comprises:

a photoresist resin composition comprising approximately 5–60 weight parts of a multifunctional acrylate monomer or oligomer, approximately 0.01–50 of a polyene compound containing at least unsaturated group the main chain of which may be substituted with esters or urethanes, approximately 0.1–50 weight parts of a multifunctional thiol compound, approximately 0.1–50 weight parts of a photopolymerization initiator and other additives, and an organic solvent, based on 100 weight parts of a binder resin, represented by the following general formula I:

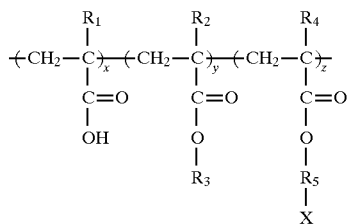 [I]

wherein
$R_1$ is H, $CH_3$ or $CH_2COOH$;
$R_2$ is H or $CH_3$
$R_3$ is an alkyl group containing 1 to 10 carbon atoms, a phenyl group, a benzyl group or

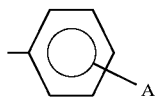

wherein
A is H, Cl, Br, F, $NO_2$, or —$C_lH_{2l+1}$ wherein l is an integer of 1 to 6;
$R_4$ is H or $CH_3$;
$R_5$ is $(CH_2)_m$ wherein m is an integer of 1 to 10;
X is —OH, —(CH=CH)$_n$H wherein n is an integer of 1 to 4, or —OCO—(—CH=CH)$_n$—B wherein n is an integer of 1 to 4 and B is

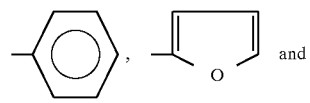 and x, y, and z represent mole ratios among the moieties, ranging from 5 to 40 mole %, 30 to 95 mole % and 0.1 to 75 mole %, respectively; and a pigment-dispersed composition comprising pigment.

2. A pigment-dispersed photoresist composition in accordance with claim 1, wherein said multifunctional thiol compound is selected from a group consisting of glycol dimercaptoacetate, trimethylolethane tris(3-mercaptopropionate), and pentaerythritoltetrakis (thioglycolate).

3. A pigment-dispersed photoresist composition in accordance with claim 1, wherein said photopolymerization initiator is selected benzophenones, acetophenones, thioxantones and the mixtures thereof.

4. A pigment-dispersed photoresist composition in accordance with claim 1, wherein said organic solvent is selected from a group consisting of toluene, xylene, ethylcellosolve, ethylcellosolve acetate, diclime, cyclohexanonetoluene, and the mixtures thereof.

* * * * *